(12) United States Patent
Liu

(10) Patent No.: US 10,110,242 B2
(45) Date of Patent: Oct. 23, 2018

(54) INTERLEAVING SUCCESSIVE APPROXIMATION ANALOG-TO-DIGITAL CONVERTER WITH NOISE SHAPING

(71) Applicant: MEDIATEK INC., Hsin-Chu (TW)

(72) Inventor: Chun-Cheng Liu, Xianxi Township, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/830,327

(22) Filed: Dec. 4, 2017

(65) Prior Publication Data

US 2018/0183450 A1    Jun. 28, 2018

Related U.S. Application Data

(60) Provisional application No. 62/439,196, filed on Dec. 27, 2016.

(51) Int. Cl.
*H03M 1/38* (2006.01)
*H03M 1/08* (2006.01)
*H03M 1/12* (2006.01)

(52) U.S. Cl.
CPC ............ *H03M 1/0854* (2013.01); *H03M 1/12* (2013.01); *H03M 1/38* (2013.01)

(58) Field of Classification Search
CPC ......... H03M 1/0854; H03M 1/38; H03M 1/12
USPC ................................................ 341/155, 161
See application file for complete search history.

(56) References Cited

U.S. PATENT DOCUMENTS

| 8,120,520 B2 * | 2/2012 | Jeong | H03M 1/46 341/155 |
| 8,427,355 B2 * | 4/2013 | Sin | H03M 1/1225 324/658 |
| 9,455,737 B1 * | 9/2016 | Rajaee | H03M 3/464 |
| 9,722,746 B2 * | 8/2017 | Ho | H04L 5/0041 |
| 2016/0035235 A1 | 2/2016 | Allon et al. | |

OTHER PUBLICATIONS

Fredenburg, J., et al.; "A 90MS/s 11MHz Bandwidth 62dB SNDR Noise-Shaping SAR ADC;" IEEE International Solid-State Circuits Conference; 2012; pp. 468-470.
Lin, J., et al.; "A 15.5 dB, Wide Signal Swing, Dynamic Amplifier Using a Common-Mode Voltage Detection Technique;" IEEE; 2011; pp. 21-24.
Fredenburg, J.A.; "Noise-shaping SAR ADCs;" Dissertation for Doctor of Philosophy (Electrical Engineering) in the University of Michigan; 2015; pp. 1-160.
Waters, A., et al.; "Highly time-Interleaved noise-shaped SAR ADC with reconfigurable order;" IEEE; 2016; pp. 1026-1029.

\* cited by examiner

*Primary Examiner* — Brian Young
(74) *Attorney, Agent, or Firm* — McClure, Qualey & Rodack, LLP

(57) ABSTRACT

An interleaving successive approximation analog-to-digital converter (SAR ADC) with noise shaping having a first SAR block, a second SAR block, and a noise-shaping circuit is provided. The first and second SAR blocks take turns to sample an input voltage for successive approximation of the input voltage and observation of a digital representation of the input voltage. The noise-shaping circuit receives a first residue voltage from the first SAR block and receives a second residue voltage from the second SAR block alternately, and outputs a noise-shaping signal to be fed into the first SAR block and the second SAR block.

20 Claims, 5 Drawing Sheets

INTERLEAVING SUCCESSIVE APPROXIMATION ANALOG-TO-DIGITAL CONVERTER WITH NOISE SHAPING

CROSS REFERENCE TO RELATED APPLICATIONS

This application claims the benefit of U.S. Provisional Application No. 62/439,196, filed Dec. 27, 2016, the entirety of which is incorporated by reference herein.

BACKGROUND OF THE INVENTION

Field of the Invention

The present invention relates to analog-to-digital converters (ADCs).

Description of the Related Art

In electronics, an analog-to-digital converter is a system that converts an analog input into a digital signal. ADCs with charge-redistribution successive approximation (SAR) are common today.

FIG. 1 depicts an example of a successive approximation analog-to-digital converter (SAR ADC). During the first operation phase, an input voltage Vin is bottom-plate sampled onto a weighted capacitor array 102. After this sampling phase, the bottom plates of the capacitors within the weighted capacitor array 102 are switched to a common-mode voltage GND for a successive approximation scheme. The comparator 104 tests the sign of the sampled voltage (obtained from the top plate TP of the weighted capacitor array 102) and the sign decision output from the comparator 104 is fed back to switch the bottom plate voltage of the current MSB (Most Significant Bit) capacitor within the weighted capacitor array 102. When a voltage subtraction is required, the bottom plate of the current MSB capacitor is switched to the lower reference voltage Vrefl. When a voltage addition is required, the bottom plate of the current MSB capacitor is switched to the higher reference voltage Vrefh. The bottom plates of the capacitors within the weighted capacitor array 102 are switched one by one in the successive approximation scheme. The output of the comparator 104 is collected and transformed to a digital representation Dout of the input voltage Vin.

However, the sampling phase plus the successive approximation scheme limit the speed of the analog-to-digital conversion.

Furthermore, quantization error and noise from the comparator 104 should also be taken into consideration when designing an analog-to-digital converter.

BRIEF SUMMARY OF THE INVENTION

An interleaving successive approximation analog-to-digital converter (SAR ADC) with noise-shaping is shown.

An interleaving SAR ADC with noise shaping in accordance with an exemplary embodiment of the disclosure has a first SAR block, a second SAR block, and a noise-shaping circuit. The first and second SAR blocks take turns to sample an input voltage for successive approximation of the input voltage and observation of a digital representation of the input voltage. The noise-shaping circuit receives a first residue voltage from the first SAR block and receives a second residue voltage from the second SAR block alternately, and outputs a noise-shaping signal to be fed into the first SAR block and the second SAR block.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
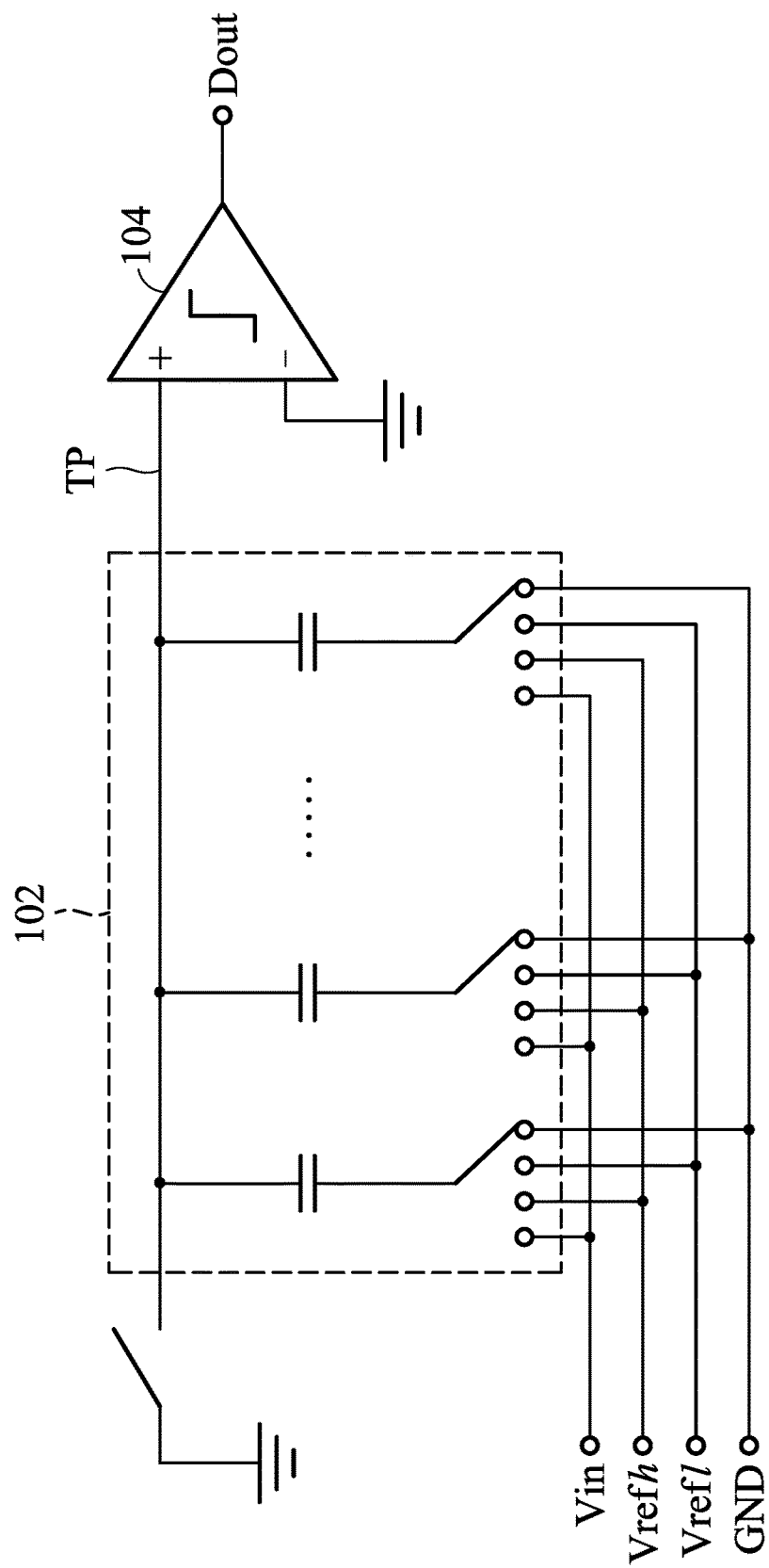
FIG. 1 depicts an example of a SAR ADC.

Referring to the SAR ADC of FIG. 1, the top plate TP of the weighted capacitor array 102 is coupled to the comparator 104 for trials of successive approximation (by which the comparator 104 outputs a series of comparison result to switch the weighted capacitor array 102 to successive approximate the value of the input voltage Vin). In the disclosure, a residue voltage (Vres hereinafter) of successive approximation (e.g., a voltage value retrieved from the top plate TP of the weighted capacitor array 102) is further used to develop a noise shaping technique. A noise-shaping signal (Sns hereinafter) is generated from the residue voltage Vres and fed to the negative input of the comparator 104 and thereby quantization noise and comparator noise of a SAR ADC are attenuated.

Figure 2:
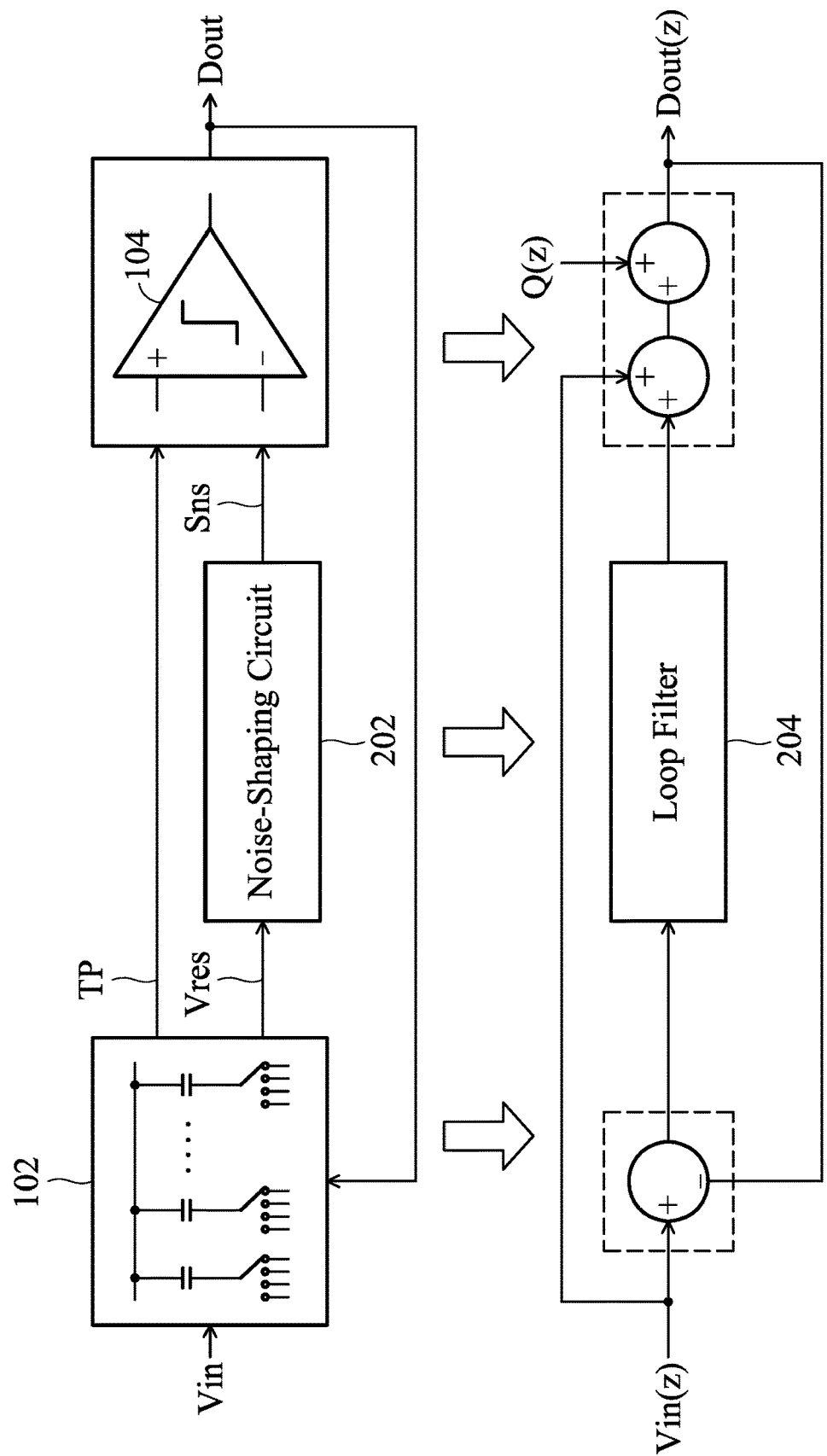
FIG. 2 depicts a SAR ADC with noise shaping.

FIG. 2 depicts a SAR ADC with noise shaping. In the upper illustration of FIG. 2, a functional representation of a SAR ADC with noise shaping is shown. In addition to the basic SAR architecture including the weighted capacitor array 102 and the comparator 104 described in FIG. 1, the upper illustration further illustrates a noise-shaping circuit 202 which is operative to transform the residue voltage Vres output by the weighted capacitor array 102 to provide the negative input of the comparator 104 with the noise-shaping signal Sns. For an N-bit analog-to-digital conversion, the residue voltage Vres may be obtained from the top plate TP of the weighted capacitor array 102 after the $N_{th}$ decision is made by the comparator 104. The residue voltage Vres, therefore, contains the noise information. After being processed by the noise-shaping circuit 202, the residue voltage Vres is transformed to the noise-shaping signal Sns to shape the noise in the succeeding analog-to-digital conversion(s). In the lower illustration of FIG. 2, an equivalent signal flow diagram is shown. The noise-shaping circuit 202 introduces a loop filter 204 in the z transfer function of the SAR ADC. The quantization noise Q or even the comparator noise (not shown in the figure) can be reduced by the noise-shaping technique.

The noise-shaping circuit 202 may simply include a battery capacitor that is charge-shared with the top plate TP of the weighted capacitor array 102. In some examples, the noise-shaping circuit 202 may further include an integrator coupled to the battery capacitor. In other examples, the noise-shaping circuit 202 includes cascaded circuits which form a cascaded FIR-IIR loop filter. Any circuit that imitates the noise within the analog-to-digital converter may be used as the noise-shaping circuit 202.

To achieve a higher conversion rate, a concept of time interleaving is introduced here.

Figure 3:
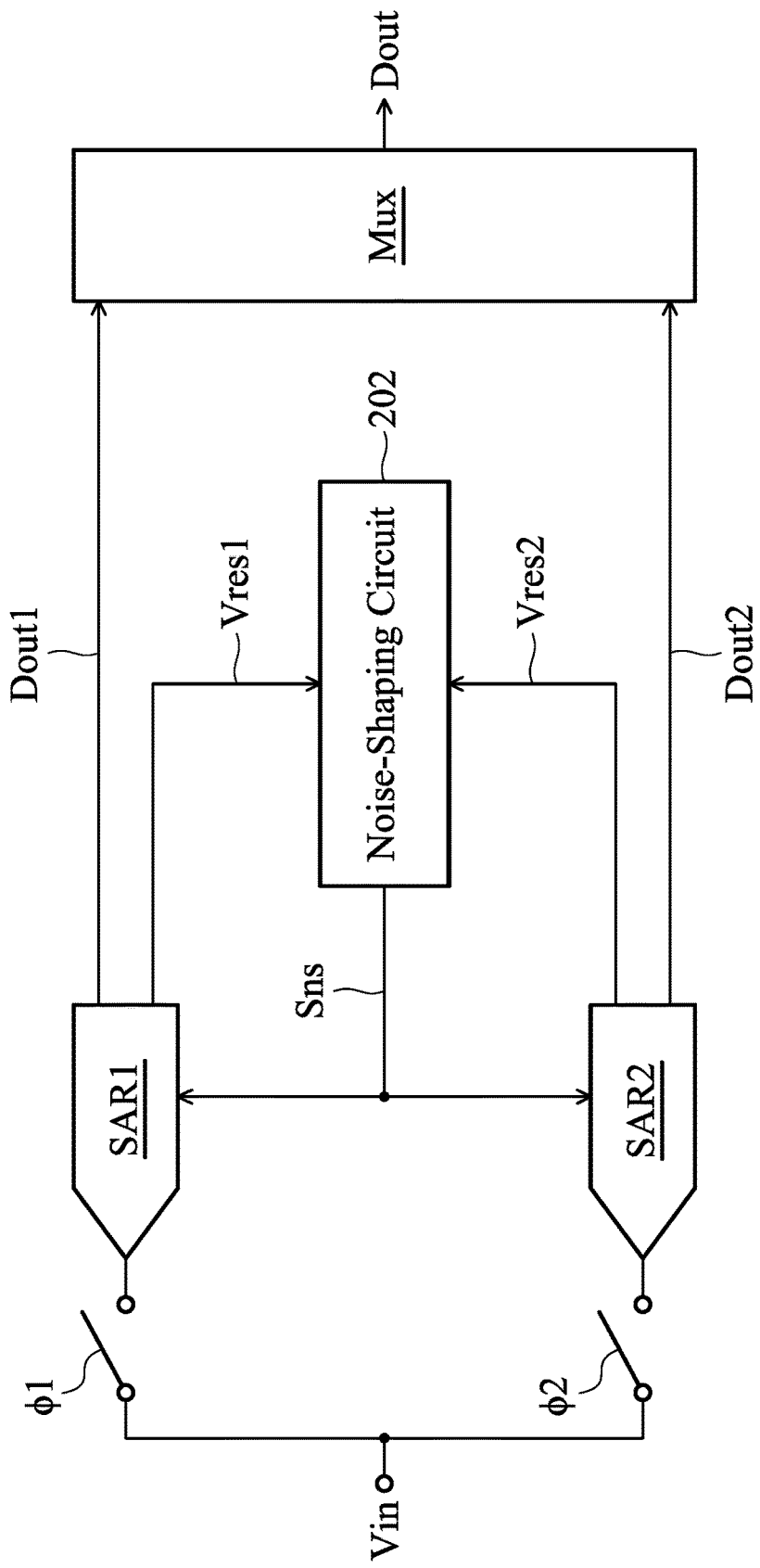
FIG. 3 depicts an interleaving SAR ADC with noise shaping in accordance with an exemplary embodiment of the disclosure.

FIG. 3 depicts an interleaving SAR ADC with noise shaping in accordance with an exemplary embodiment of the disclosure. Based on the basic SAR architecture used with the noise shaping circuit 202 (referring back to FIG. 2), a SAR block SAR1 and another SAR block SAR2 are provided in FIG. 3. The SAR block SAR1 and the SAR block SAR2 are switched (by the control signals φ1 and φ2) to sample the input voltage Vin in an interleaving way. When one of the SAR blocks SAR1 or SAR2 is sampling the input voltage Vin, the other is performing successive approximation or even residue sampling. A higher net sample rate is achieved. As shown, the noise-shaping circuit 202 is shared by the two SAR blocks SAR1 or SAR2. The residue voltages Vres1 and Vres2 from the SAR blocks SAR1 and SAR2 are sampled into the noise-shaping circuit 202 alternately. Therefore, the noise-shaping signal Sns generated by the noise-shaping circuit 202 based on the interleaving residue voltages Vres1 and Vres2 includes sufficient noise information. The noise-shaping signal Sns is coupled to both of the SAR blocks SAR1 and SAR2. The successive approximation performed in the SAR blocks SAR1 and SAR2 is considerably improved. The digital representation Dout1 obtained by the SAR block SAR1 and the digital representation Dout2 obtained by the SAR block SAR2 are output by the multiplexer Mux as Dout. A changed input voltage Vin can be converted to a digital form and represented by the digital representation Dout.

Figure 4:
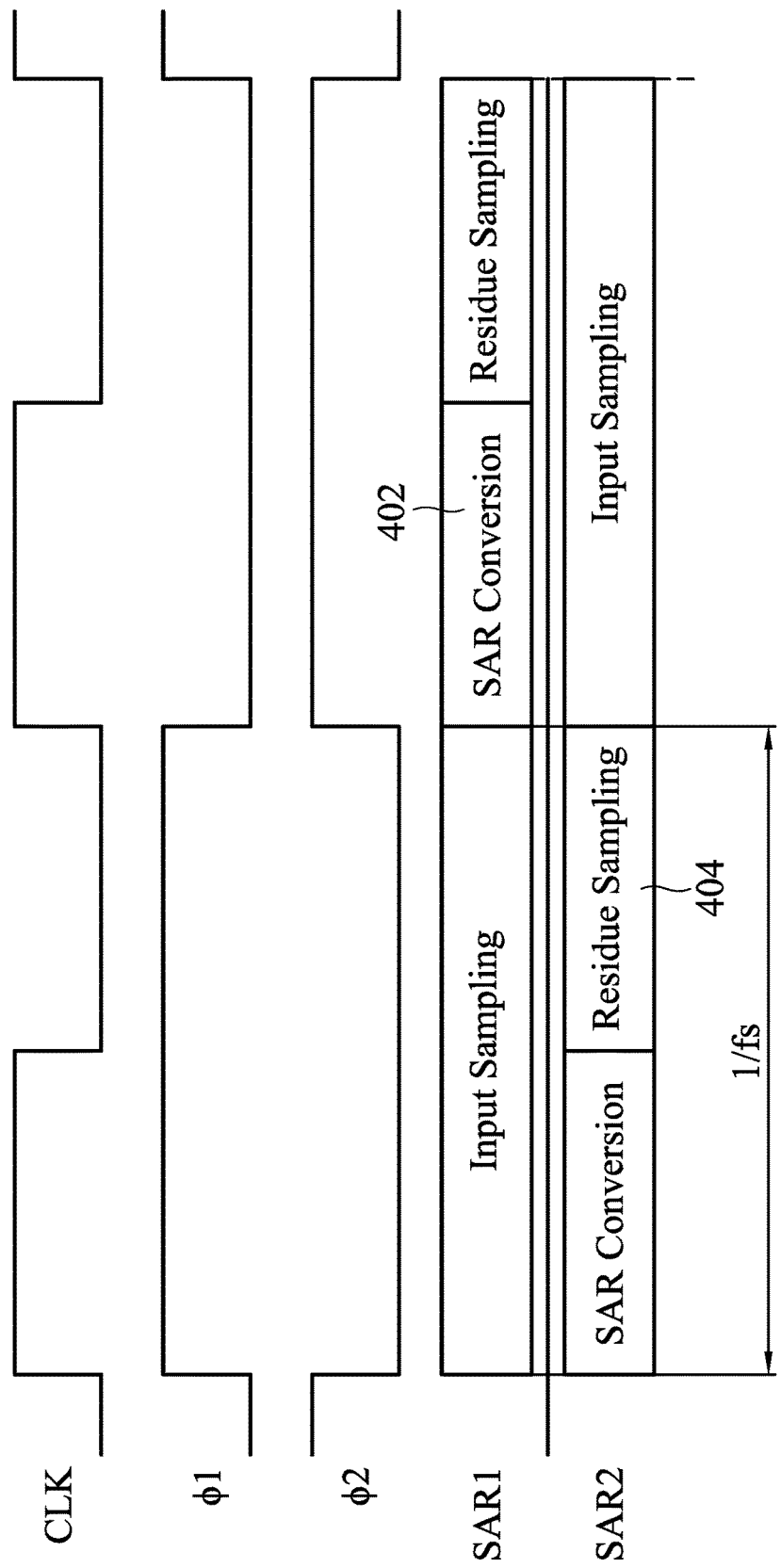
FIG. 4 depicts a timing diagram for operating the ADC of FIG. 3 in accordance with an exemplary embodiment of the disclosure.

FIG. 4 depicts a timing diagram for operating the ADC of FIG. 3 in accordance with an exemplary embodiment of the disclosure. Referring to the control signals φ1 and φ2, the SAR blocks SAR1 and SAR2 each uses a full input sampling cycle (1/fs) to sample the input voltage Vin. The bandwidth requirement of the front-end buffer preceding the ADC, therefore, is relaxed. When the SAR block SAR1 samples the input voltage Vin, the SAR block SAR2 performs successive approximation and holds the residue voltage Vres2 for the noise-shaping circuit 202 to sample. As shown, a half input sampling cycle of SAR conversion is followed by another half input sampling cycle of residue sampling. When the input voltage Vin is switched to be sampled by the SAR block SAR2, the SAR block SAR1 is switched to perform the successive approximation and holds the residue voltage Vres1 for the noise-shaping circuit 202 to sample. The residue voltage Vres1/Vres2 is transformed to the noise-shaping signal Sns by the noise-shaping circuit 202. When the SAR conversion 402 is performed, the residue voltage Vres1/Vres2 obtained in the earlier residue sampling (e.g., the residue voltage Vres2 obtained in the residue sampling 404) may be taken into consideration, depending on the delay provided by the loop filter 204. In comparison with the SAR ADC of FIG. 2 that uses only a single SAR block, the ADC of FIG. 3 containing more than one SAR block and operated according to the timing diagram of FIG. 4 achieves a higher sampling rate fs.

Figure 5:
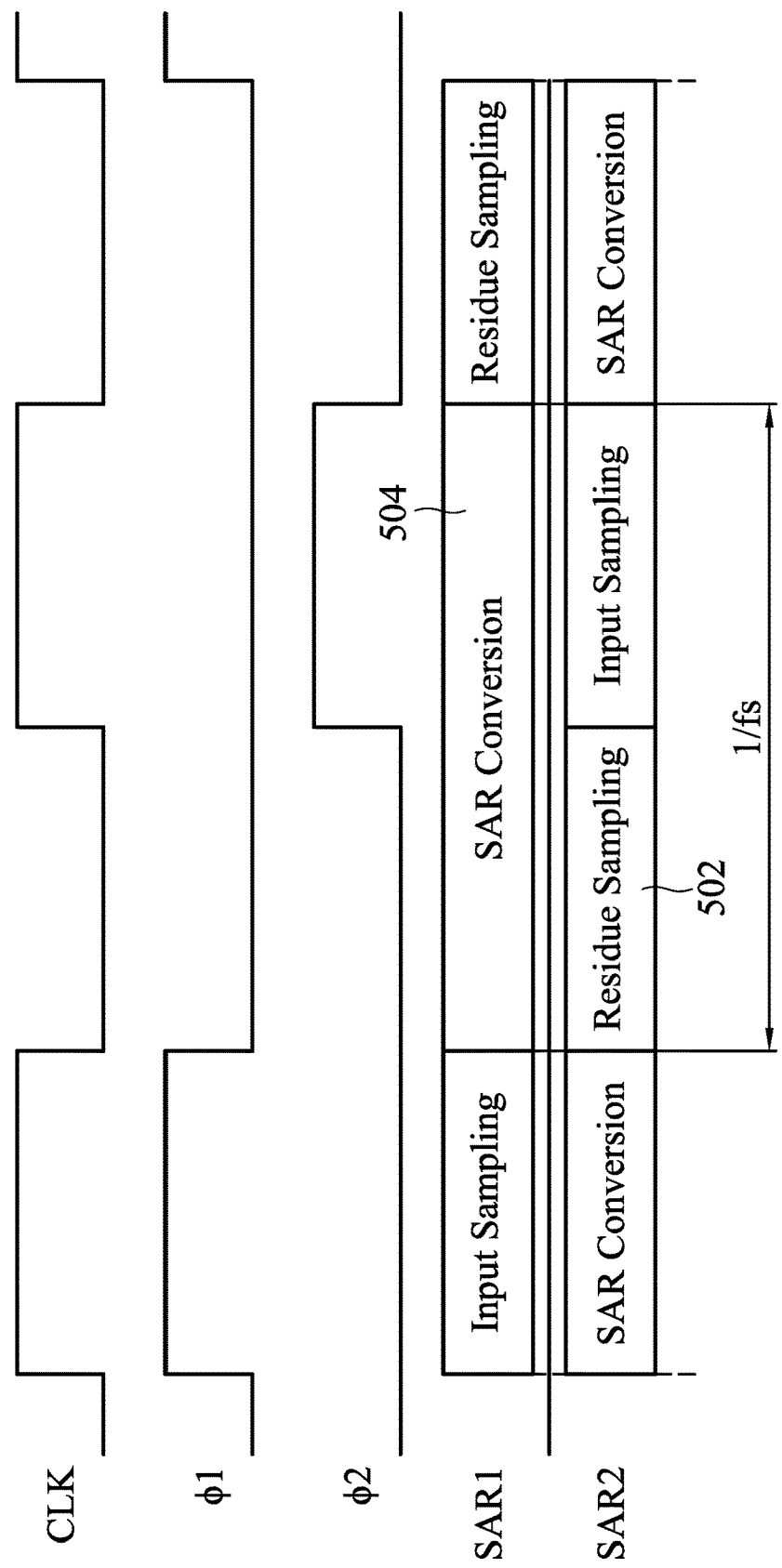
FIG. 5 depicts a timing diagram for operating the ADC of FIG. 3 in accordance with another exemplary embodiment of the disclosure.

FIG. 5 depicts a timing diagram for operating the ADC of FIG. 3 in accordance with another exemplary embodiment of the disclosure. Referring to the control signals φ1 and φ2, the SAR blocks SAR1 and SAR2 each use only a half input sampling cycle (½ fs) to sample the input voltage Vin. The SAR block SAR1 samples the input voltage Vin when the SAR block SAR2 is still in the SAR conversion process. When the SAR block SAR1 ends the input sampling, the SAR block SAR2 also ends the SAR conversion. Then, the SAR block SAR1 starts the SAR conversion that lasts a full input sample cycle (1/fs) and the noise-shaping circuit 202 starts sampling the residue voltage Vres2 that lasts a half input sampling cycle. After the residue sampling, the SAR block SAR2 performs the next sampling process of the input voltage Vin and meanwhile the SAR block SAR1 continues the SAR conversion. The SAR conversion of the SAR block SAR1 ends with the input sampling process of the SAR block SAR2. Then, the noise-shaping circuit 202 is switched to sample the residue voltage Vres1 and the SAR block SAR2 is switched to do successive approximation. The residue voltage Vres1/Vres2 is transformed to the noise-shaping signal Sns by the noise-shaping circuit 202. When the SAR conversion is performed, the residue voltage Vres1/Vres2 obtained in the earlier residue sampling may be taken into consideration, depending on the delay provided by the loop filter 204. For example, the residue voltage Vres2 obtained in interval 502 may be used later in the SAR conversion 504. In comparison with the SAR ADC of FIG. 2 that uses only a single SAR block, the ADC of FIG. 3 containing more than one SAR block and operated according to the timing diagram of FIG. 5 achieves a higher sampling rate fs.

In addition to the two-way interleaving architecture described in FIG. 3, more than two SAR blocks may be used in other exemplary embodiments of the disclosure for a higher-order interleaving architecture. The input voltage Vin is sampled by the different SAR blocks alternately to guarantee a high sampling rate. For each SAR block, there is sufficient time to perform SAR conversion and residue sampling while the other SAR blocks take turns in sampling the input voltage Vin.

The control of the SAR ADC of the disclosure is organized as follows.

In some exemplary embodiments, the input sampling interval of the first SAR block SAR1 overlaps the residue sampling interval of the second SAR block SAR2. The residue sampling interval of the second SAR block SAR2 and the input sampling interval of the first SAR block SAR1 may end together. The input sampling interval of the first SAR block SAR1 may last a full input sampling cycle 1/fs. The input sampling interval of the second SAR block SAR2 repeated after the residue sampling interval of the second SAR block SAR2 and following the input sampling interval of the first SAR block SAR1 may also last a full input sampling cycle 1/fs. The SAR conversion interval of the first SAR block SAR1 may start with the input sampling interval of the second SAR block SAR2. The residue sampling interval of the first SAR block SAR1 may overlap the input sampling interval of the second SAR block SAR2. The residue sampling interval of the first SAR block SAR1 and the input sampling interval of the second SAR block SAR2 may end together. The SAR interval and the residue sampling interval of the first SAR block SAR1 each may last a half input sampling cycle ½ fs. The input sampling interval of the first SAR block SAR1 may further overlap the SAR conversion interval of the second SAR block SAR2. The SAR conversion interval of the second SAR block SAR2 and the input sampling interval of the first SAR block SAR1 may start together. The SAR interval and the residue sampling interval of the second SAR block SAR2 each may last a half input sampling cycle ½ fs. The control scheme depicted in FIG. 4 is one example of these exemplary control schemes.

In some exemplary embodiments, the input sampling interval of the first SAR block SAR1 overlaps a SAR conversion interval of the second SAR block SAR2. The input sampling interval of the first SAR block SAR1 and the SAR conversion interval of the second SAR block SAR2 may end together. For the second SAR block SAR2, the residue sampling interval plus the input sampling interval may equal a full input sampling cycle 1/fs and may be allocated within the SAR conversion interval of the first SAR block SAR1. The SAR interval of the first SAR block SAR1 lasts a full input sampling cycle 1/fs. The input sampling interval and the residue sampling interval of the first SAR block SAR1 each may last a half input sampling cycle ½ fs. The input sampling interval and the residue sampling interval of the second SAR block SAR2 each may last a half input sampling cycle ½ fs. The control scheme depicted in FIG. 5 is one example of these exemplary control schemes.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interleaving successive approximation analog-to-digital converter with noise shaping, comprising:
   a first successive approximation block and a second successive approximation block, taking turns to sample an input voltage for successive approximation of the input voltage and observation of a digital representation of the input voltage; and
   a noise-shaping circuit, receiving a first residue voltage from the first successive approximation block and receiving a second residue voltage from the second successive approximation block alternately, and outputting a noise-shaping signal to be fed into the first successive approximation block and the second successive approximation block.

2. The interleaving successive approximation analog-to-digital converter with noise shaping as claimed in claim 1, wherein:
   an input sampling interval of the first successive approximation block overlaps a residue sampling interval of the second successive approximation block;
   the residue sampling interval of the second successive approximation block follows a successive approximation conversion interval of the second successive approximation block;
   during the input sampling interval of the first successive approximation block, the first successive approximation block samples the input voltage;
   during the successive approximation conversion interval of the second successive approximation block, the second successive approximation block performs successive approximation of the input voltage; and
   during the residue sampling interval of the second successive approximation block, the second successive approximation block holds the second residue voltage for the noise-shaping circuit to sample.

3. The interleaving successive approximation analog-to-digital converter with noise shaping as claimed in claim 2, wherein:
   the residue sampling interval of the second successive approximation block and the input sampling interval of the first successive approximation block end together.

4. The interleaving successive approximation analog-to-digital converter with noise shaping as claimed in claim 3, wherein:
   the input sampling interval of the first successive approximation block lasts a full input sampling cycle.

5. The interleaving successive approximation analog-to-digital converter with noise shaping as claimed in claim 4, wherein:
   an input sampling interval of the second successive approximation block is repeated after the residue sampling interval of the second successive approximation block;
   during the input sampling interval of the second successive approximation block, the second successive approximation block samples the input voltage;
   the input sampling interval of the second successive approximation block follows and the input sampling interval of the first successive approximation block; and
   the input sampling interval of the second successive approximation block lasts a full input sampling cycle.

6. The interleaving successive approximation analog-to-digital converter with noise shaping as claimed in claim 5, wherein:
   a successive approximation conversion interval of the first successive approximation block starts with the input sampling interval of the second successive approximation block; and
   during the successive approximation conversion interval of the first successive approximation block, the first successive approximation block performs successive approximation of the input voltage.

7. The interleaving successive approximation analog-to-digital converter with noise shaping as claimed in claim 6, wherein:
   a residue sampling interval of the first successive approximation block follows the successive approximation conversion interval of the first successive approximation block;
   during the residue sampling interval of the first successive approximation block, the noise-shaping circuit samples the first residue voltage of first successive approximation block; and
   the residue sampling interval of the first successive approximation block overlaps the input sampling interval of the second successive approximation block.

8. The interleaving successive approximation analog-to-digital converter with noise shaping as claimed in claim 7, wherein:
   the residue sampling interval of the first successive approximation block and the input sampling interval of the second successive approximation block end together.

9. The interleaving successive approximation analog-to-digital converter with noise shaping as claimed in claim 8, wherein:
   the successive approximation conversion interval of the first successive approximation block lasts a half input sampling cycle; and
   the residue sampling interval of the first successive approximation block lasts a half input sampling cycle.

10. The interleaving successive approximation analog-to-digital converter with noise shaping as claimed in claim 9, wherein:

the input sampling interval of the first successive approximation block further overlaps the successive approximation conversion interval of the second successive approximation block.

11. The interleaving successive approximation analog-to-digital converter with noise shaping as claimed in claim 10, wherein:

the successive approximation conversion interval of the second successive approximation block and the input sampling interval of the first successive approximation block start together.

12. The interleaving successive approximation analog-to-digital converter with noise shaping as claimed in claim 11, wherein:

the successive approximation conversion interval of the second successive approximation block lasts a half input sampling cycle; and the residue sampling interval of the second successive approximation block lasts a half input sampling cycle.

13. The interleaving successive approximation analog-to-digital converter with noise shaping as claimed in claim 1, wherein:

an input sampling interval of the first successive approximation block overlaps a successive approximation conversion interval of the second successive approximation block;

during the input sampling interval of the first successive approximation block, the first successive approximation block samples the input voltage;

during the successive approximation conversion interval of the second successive approximation block, the second successive approximation block performs successive approximation of the input voltage.

14. The interleaving successive approximation analog-to-digital converter with noise shaping as claimed in claim 13, wherein:

the input sampling interval of the first successive approximation block and the successive approximation conversion interval of the second successive approximation block end together.

15. The interleaving successive approximation analog-to-digital converter with noise shaping as claimed in claim 14, wherein:

a residue sampling interval of the second successive approximation block follows the successive approximation conversion interval of the second successive approximation block;

during the residue sampling interval of the second successive approximation block, the noise-shaping circuit samples the second residue voltage of second successive approximation block;

an input sampling interval of the second successive approximation block is repeated after the residue sampling interval of the second successive approximation block;

during the input sampling interval of the second successive approximation block, the second successive approximation block samples the input voltage; and the residue sampling interval of the second successive approximation block plus the input sampling interval of the second successive approximation block equals a full input sampling cycle.

16. The interleaving successive approximation analog-to-digital converter with noise shaping as claimed in claim 15, wherein:

a successive approximation conversion interval of the first successive approximation block follows the input sampling interval of the first successive approximation block;

during the successive approximation conversion interval of the first successive approximation block, the first successive approximation block performs successive approximation of the input voltage; and the residue sampling interval of the second successive approximation block and the input sampling interval of the second successive approximation block are within the successive approximation conversion interval of the first successive approximation block.

17. The interleaving successive approximation analog-to-digital converter with noise shaping as claimed in claim 16, wherein:

the successive approximation conversion interval of the first successive approximation block lasts a full input sampling cycle.

18. The interleaving successive approximation analog-to-digital converter with noise shaping as claimed in claim 17, wherein:

a residue sampling interval of the first successive approximation block follows the successive approximation conversion interval of the first successive approximation block; and during the residue sampling interval of the first successive approximation block, the noise-shaping circuit samples the first residue voltage of first successive approximation block.

19. The interleaving successive approximation analog-to-digital converter with noise shaping as claimed in claim 18, wherein:

the input sampling interval of the first successive approximation block lasts a half input sampling cycle;

the residue sampling interval of the first successive approximation block lasts a half input sampling cycle;

the residue sampling interval of the second successive approximation block lasts a half input sampling cycle; and the input sampling interval of the second successive approximation block lasts a half input sampling cycle.

20. The interleaving successive approximation analog-to-digital converter as claimed in claim 1, further comprising:

a multiplexer, outputting a first digital representation from the first successive approximation block and outputting a second digital representation from the second successive approximation block alternately to form the digital representation of the input voltage.

* * * * *